United States Patent [19]

Hallen

[11] 3,715,609

[45] Feb. 6, 1973

[54] TEMPERATURE COMPENSATION OF VOLTAGE CONTROLLED RESISTOR

[75] Inventor: Thor Oscar Hallen, Aloha, Oreg.

[73] Assignee: Tektronix, Inc., Beaverton, Oreg.

[22] Filed: Aug. 17, 1971

[21] Appl. No.: 172,466

[52] U.S. Cl. ......................307/310, 307/251, 330/23
[51] Int. Cl. ..............................................H03k 3/26
[58] Field of Search .................307/310, 251; 330/23

[56] References Cited

UNITED STATES PATENTS

| | | | |
|---|---|---|---|
| 3,182,201 | 5/1965 | Sklar | 307/310 |
| 3,531,655 | 9/1970 | Taylor | 307/310 |
| 3,611,172 | 10/1971 | Gauld | 330/23 |
| 3,117,253 | 1/1964 | Antoszewski | 330/23 |

*Primary Examiner*—Archie R. Borchelt
*Assistant Examiner*—Harold A. Dixon
*Attorney*—Stephen W. Blore et al.

[57] ABSTRACT

A voltage controlled resistor of the junction gate field effect type is temperature compensated by a circuit including the emitter-base junction of a bipolar transistor and also a temperature responsive resistor having a temperature sensitivity which is substantially the same as that of the channel of the voltage controlled resistor. The temperature responsive resistor and the bipolar transistor are subjected to substantially the same temperature conditions as the voltage variable resistor and the voltage responsive resistor and emitter-base junction of the bipolar transistor are connected in series with a current source. The voltage drops across such emitter-base junction and voltage responsive resistor vary with such temperature and are employed as parts of a reverse-bias potential applied between the gate and channel of the voltage controlled resistor.

7 Claims, 1 Drawing Figure

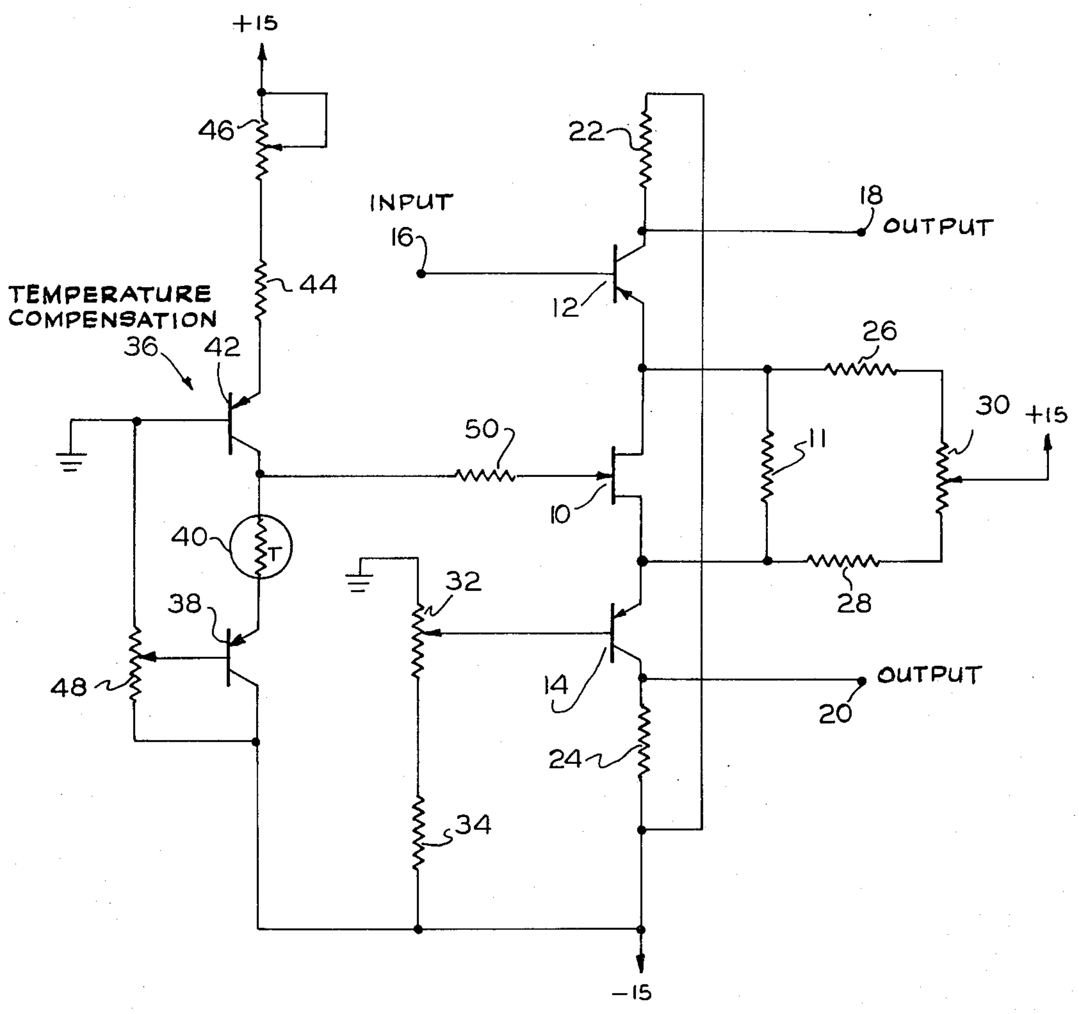
THOR OSCAR HALLEN
*INVENTOR*
*BY*
*BUCKHORN, BLORE, KLARQUIST & SPARKMAN*
*ATTORNEYS*

TEMPERATURE COMPENSATION OF VOLTAGE CONTROLLED RESISTOR

BACKGROUND OF THE INVENTION

Field effect transistors of either the N channel or P channel type with a PN junction between the gate and channel have been employed as adjustable or variable voltage controlled resistors particularly in integrated or hybrid circuits designed for high frequency operation. In such circuits there is no room for a conventional potentiometer. Also the leads to an external potentiometer would add excessive capacitance and inductance to the circuit. At constant temperature, the resistance measured between the two connections to the channel of a voltage controlled resistor is a function of a reverse bias potential applied between the gate and the channel. This resistance, however, varies with changes in temperature under the usual conditions of use of such voltage controlled resistors. For many applications of voltage variable resistors it is desirable to have the gate symmetrically disposed with respect to the channel so that either connection to the channel can be employed as a source or drain and the circuit can be such that the current flow through the channel can be in either direction.

The changes in the resistance of the channel with changes in temperature is the result of decreased mobility of the carriers in the channel and also a decrease in contact potential of the gate-channel junction as the temperature increases and vice versa. The decreased mobility of the carriers with increase in temperature causes a decrease in conductance of the channel resulting i.e. an increase in resistance measured between the two connections to the channel. The decrease in contact potential causes an increase in the pinch off voltage, thus increasing the conductance of the channel from a given gate to source reverse bias potential.

The two effects just discussed oppose each other and in a voltage controlled resistor having a bias voltage which is approximately 0.63 volts less than the pinch off voltage, the two effects are equal and opposite, and such a device will have substantially zero change in channel resistance as the temperature changes.

It is desirable in most practical circuits to employ a bias voltage much greater than 0.63 volts. In a device having such greater bias voltage, the effect of the change in mobility of the carriers in the channel is greater than that of the contact potential of the gate-channel junction so that typically, the resistance between the source and drain increases as the temperature increases and vice versa.

Prior temperature compensation circuits have employed matched pairs of field effect transistors. One of these has been used as the voltage controlled resistor. A voltage drop across the channel of the other has been compared in a comparator circuit with the voltage drop across a non temperature responsive resistor to develop an error signal when the resistance of such channel varies from a predetermined resistance as a result of a change in temperature. This error signal was then amplified and fed back to the voltage controlled resistor circuit to compensate for such temperature change. Matched pairs of field effect transistors are expensive and also considerable circuitry is required for the necessary comparator and feedback circuits.

SUMMARY OF THE INVENTION

The present invention provides a simple circuit which substantially completely compensates for the variations in the source to drain resistance of voltage controlled resistors as the temperature changes. Both the effect of changes in mobility of the carriers in the channel and the opposite effect of changes in the contact potential of the gate-channel junction are substantially completely eliminated. This is accomplished by varying a control voltage applied as a reverse bias potential between the gate and channel of the voltage controlled resistor in response to a voltage drop across a temperature responsive resistor having substantially the same temperature sensitivity as the channel of the voltage controlled resistor and also in response to a voltage drop across the emitter-base junction of a bipolar transistor. Such voltage sensitive resistor as well as the bipolar transistor are positioned so as to be subjected to substantially the same temperatures as the voltage controlled resistor.

BRIEF DESCRIPTION OF THE DRAWING

The drawing is a schematic diagram of a circuit embodying the present invention.

DESCRIPTION OF THE PREFERRED EMBODIMENT

In the FIGURE of the drawing, a voltage controlled resistor 10 is shown as having its channel connected in parallel with a resistor 11 between the emitters of a pair of PNP bipolar transistors 12 and 14 forming part of a paraphase amplifier which may, for example, be the vertical amplifier of an oscilloscope. The usual frequency compensating circuits forming part of the amplifier have been omitted in order to simplify the disclosure. Such an amplifier converts a single ended vertical signal input connected to the base of the transistor 12 through a terminal 16 into a push-pull output across the terminals 18 and 20 connected to the collectors of the transistors 12 and 14, respectively.

The collectors of the transistors 12 and 14 are also connected through load resistors 22 and 24, respectively, to a common source of negative potential with respect to the chassis ground. The emitters of such transistors are connected through resistors 26 and 28, respectively, and portions of a balance adjustment potentiometer 30 to a source of positive potential with respect to such ground. It will be understood that the impedance, so far as signal current is concerned, between the sources of negative and positive potential shown in the drawing is low so that a low impedance path for the signal exists between such sources of potential. The resistors 26 and 28 in conjunction with the source of positive potential constitute current sources for the emitter-collector circuits of the transistors 12 and 14, respectively.

An adjustable source of negative bias potential for the base of the transistor 14 is provided by a potentiometer 32 having one end connected to chassis ground and its other end connected through a resistor 34 to the negative source of potential. The potentiometer 32 may be the conventional vertical position control of an oscilloscope employed to move the image displayed on the screen of a cathode ray tube in a vertical direction.

The voltage controlled resistor 10 is shown as an N channel field effect transistor of the PN junction type. For the symmetrical circuit shown the transistor has its gate arranged symmetrically with respect to its channel so that the control of the resistance of the channel by a reverse bias voltage between the gate and channel is the same irrespective of direction of current flow through the channel. In the circuit shown such a reverse bias potential is effectively applied through the potentiometer 30 of the balance control between the midpoint of the channel of the controlled resistor 10 and the gate of such voltage controlled resistor from a temperature compensation circuit 36.

The temperature compensation circuit 36 includes a PNP transistor 38 having its emitter-base junction connected in series with a temperature responsive resistor 40 and this series circuit is connected in series with an adjustable current source including a PNP transistor 42 having its collector connected to one end of the voltage responsive resistor 40. The transistor 42 has its base connected to chassis ground and its emitter connected through a fixed resistor 44 and an adjustable resistor 46 to the positive source of potential. The collector of the transistor 38 is connected to the negative source of potential and the base of this transistor is connected to the movable contact of a potentiometer 48 which has its resistance element connected between such negative source of potential and chassis ground. The potentiometer 48 thus provides an adjustable negative bias voltage for the transistor 38.

The end of the temperature responsive resistor 40 connected to the collector of the current source transistor 36 is also connected through a resistor 50 to the gate of the voltage controlled resistor 10 so that a control potential, which varies with the voltage drop across the emitter-base junction of the transistor 38 and also with the voltage drop across the temperature responsive resistor 40, is applied between the gate of the voltage controlled resistor 10 and the midpoint of the channel of such voltage controlled resistor, through a portion of the potentiometer 48, the negative and positive potential sources, the balance control potentiometer 30 and the resistors 26 and 28.

The field effect voltage controlled resistor 10 will usually be of the silicon type and in such case the transistor 38 in the temperature compensating circuit 36 should also be of the silicon type so that the contact potential of the PN emitter-base junction of such transistor is equal to the contact potential of the PN gate-channel junction of the voltage controlled resistor. Also in such case, the voltage responsive resistor 40 should be of silicon so as to have the same temperature coefficient of resistance as the channel of the voltage controlled resistor 10. The resistance value of the temperature responsive resistor 40 is not critical and its value is selected so that the voltage drop across such resistor will be sufficient to result in the desired reverse bias voltage being applied between the gate and channel of the voltage controlled resistor 10 as a result of a current flow of a few milliamperes, usually not more than 10 ma, when the circuit 36 is adjusted as described below.

In operation, the temperature compensating circuit 36 is adjusted by first short circuiting the temperature responsive resistor 40 and moving the contact of the potentiometer 48 to the negative voltage end of such potentiometer so as to apply a pinch off voltage to the voltage controlled resistor 10. A signal is applied to the terminal 16 and the contact of the potentiometer 48 advanced toward the more positive end of such potentiometer until an output signal across the terminals 18 and 20 is just detected. This means that the voltage on the emitter of the transistor 38 is at the pinch off voltage. The short circuit is then removed from the temperature responsive resistor and the variable resistor 46 adjusted to adjust the current flow through the temperature responsive resistor and the resultant voltage drop across such resistor until the amplifier including the transistor 12 and 14 has the desired gain.

After the above described adjustments have been made, the gain of the amplifier can be calibrated at any time by merely adjusting the variable resistance 46. Under these conditions the change in resistance of the channel of the voltage controlled resistor, caused by a change in contact potential of the PN junction voltage controlled resistor due to a temperature change, is substantially completely compensated by the concurrent change in contact potential of the emitter-base junction of the transistor 38 and the opposite change in resistance of the channel of the voltage controlled resistor, due to a change in mobility of the current carriers in such channel, is substantially completely compensated by the change in voltage drop across the temperature responsive resistor 40.

While the invention has been described with reference to a symmetrical circuit such as a push-pull amplifier having a symmetrical type of voltage controlled resistor having a gate symmetrically disposed with respect to its channel, it is apparent that the same type of temperature compensation circuit can be employed in single ended circuits in which a non symmetrical type of field effect transistor can be employed as the voltage controlled resistor. Also it is apparent that a P channel type of field effect transistor can be employed as the voltage controlled resistor, for example, by substituting NPN transistors for the PNP transistors shown in the temperature compensation circuit.

I claim:

1. A temperature compensating circuit for a field effect voltage controlled resistor having a temperature sensitive channel of semiconductor material and a gate forming a PN junction with said channel; said circuit comprising:

means for developing a control voltage which varies with a first voltage drop across the emitter-base junction of a bipolar transistor subjected to substantially the same temperature conditions as said voltage controlled resistor and also varies with a second voltage drop across a temperature responsive resistor also subjected to said temperature conditions;

said emitter-base junction having a contact potential substantially the same as the contact potential of said junction of said voltage controlled resistor and said temperature responsive resistor having substantially the same voltage sensitivity as said channel;

and means for applying said control voltage as part of a reverse bias potential between said gate and said channel so as to cause said first voltage drop to compensate for changes in said contact potential of said voltage controlled resistor and said second voltage drop to compensate for changes in resistance of said channel produced by changes in temperature of said voltage controlled resistor.

2. A temperature compensating circuit for a field effect voltage controlled resistor having a temperature sensitive channel of semiconductor material and a gate forming a PN junction with said channel; said circuit comprising:

means for developing a control voltage which varies with a voltage drop across the emitter-base junction of a bipolar transistor subjected to substantially the same temperature conditions as said voltage controlled resistor and also varies with voltage drop across a temperature responsive resistor also subjected to said temperature conditions;

said emitter-base junction having a contact potential substantially the same as the contact potential of said junction of said voltage controlled resistor and said temperature responsive resistor having substantially the same voltage sensitivity as said channel;

means for applying said control voltage as part of a reverse bias potential between said gate and said channel so as to compensate for changes in resistance of said channel produced by changes in temperature of said voltage controlled resistor;

said circuit means includes means connecting the emitter-collector circuit of said bipolar transistor in a series circuit with said temperature responsive resistor and also connecting said series circuit in series with a current source and means for connecting said series circuit between said gate and said channel.

3. The temperature compensating circuit of claim 2 which also includes:

means for applying an adjustable forward bias between the base and emitter of said bipolar transistor to adjust the voltage between said collector and emitter of said bipolar transistor to thereby adjust the compensating effect of said control voltage on the resistance of said channel.

4. The temperature compensating circuit of claim 3 which also includes:

means for adjusting said current source to adjust the current through said series circuit and the voltage drop across said temperature responsive circuit to thereby adjust the resistance of said channel.

5. The temperature compensating circuit of claim 2 in which the channel of said voltage controlled resistor has its gate arranged symmetrically with respect to its channel so as to cause the control of the resistance of said channel by a reverse bias potential between said gate and channel to be independent of the direction of current flow through said channel and in which said channel is connected between the emitters of a pair of bipolar transistors forming part of a paraphase amplifier having said emitters of said pair of transistors each connected through a current source to a source of potential.

6. The temperature compensation circuit of claim 5 in which:

said control voltage is effectively applied between the gate of said voltage controlled resistor and the midpoint of a resistance circuit connected between the ends of said channel of said voltage controlled resistor.

7. The temperature compensation circuit of claim 6 which also includes:

means for applying an adjustable forward bias between the base and emitter of said bipolar transistor subjected to the same temperature conditions as said voltage controlled resistor to thereby adjust the compensating effect of said control voltage on the resistance of said channel;

and means for adjusting the current source for said series circuit to adjust the current through said series circuit to thereby adjust the resistance of said channel to calibrate the gain of said paraphase amplifier.

* * * * *